United States Patent
Yamaguchi et al.

(10) Patent No.: US 8,018,321 B2
(45) Date of Patent: Sep. 13, 2011

(54) BAGGAGE MANAGEMENT GATE

(75) Inventors: Shoji Yamaguchi, Kanagawa (JP);
Yasunori Koda, Kanagawa (JP);
Kunihiro Takahashi, Kanagawa (JP);
Mario Fuse, Kanagawa (JP); Hiroyoshi Inoue, Kanagawa (JP); Tsukasa Matsuda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 667 days.

(21) Appl. No.: 12/073,784

(22) Filed: Mar. 10, 2008

(65) Prior Publication Data
US 2009/0072969 A1 Mar. 19, 2009

(30) Foreign Application Priority Data
Sep. 19, 2007 (JP) ................................ 2007-242490

(51) Int. Cl.
*B60R 25/00* (2006.01)
*G05B 19/00* (2006.01)
*G08B 13/14* (2006.01)
*H04B 7/00* (2006.01)

(52) U.S. Cl. ...... 340/5.7; 340/5.8; 340/5.81; 340/572.7; 455/253.2

(58) Field of Classification Search ............ 340/5.7, 340/5.8, 5.81, 5.86, 572.7, 572.8
See application file for complete search history.

(56) References Cited

U.S. PATENT DOCUMENTS

| 6,304,178 | B1 * | 10/2001 | Hayashida ................. 340/545.1 |
| 7,535,358 | B2 * | 5/2009 | Crider et al. ............... 340/572.1 |
| 7,746,228 | B2 * | 6/2010 | Sensenig et al. ........... 340/572.1 |
| 7,762,462 | B2 * | 7/2010 | Gelbman ....................... 235/451 |
| 2003/0067382 | A1 * | 4/2003 | Spiess et al. ................. 340/7.32 |
| 2003/0210145 | A1 * | 11/2003 | Manov et al. ............... 340/572.4 |

FOREIGN PATENT DOCUMENTS

| JP | A-07-105454 | 4/1995 |
| JP | A 8-185496 | 7/1996 |
| JP | A-2001-43459 | 2/2001 |
| JP | A-2005-142645 | 6/2005 |
| JP | A-2007-148840 | 6/2007 |

* cited by examiner

*Primary Examiner* — Jennifer Mehmood
*Assistant Examiner* — Mark Rushing
(74) *Attorney, Agent, or Firm* — Oliff & Berridge, PLC

(57) ABSTRACT

A baggage management gate including an exciting coil, a detecting coil and signal processing unit. The exciting coil forms an alternating magnetic field in a passage to an area from which manages objects to be carried in or carried out. The detecting coil detects a variation in the alternating magnetic field when magnetization of a magnetic material showing a large Barkhausen effect is reversed in the alternating magnetic field. The signal processing unit determines as to whether the magnetization reversal occurs in the alternating magnetic field due to the large Barkhausen effect or not, based on a signal detected by the detecting coil. The signal processing unit includes amplifier that amplifies the signal detected by the detecting coil with plural different amplification factors and output the amplified signals with each of the plural different amplification factors.

2 Claims, 8 Drawing Sheets

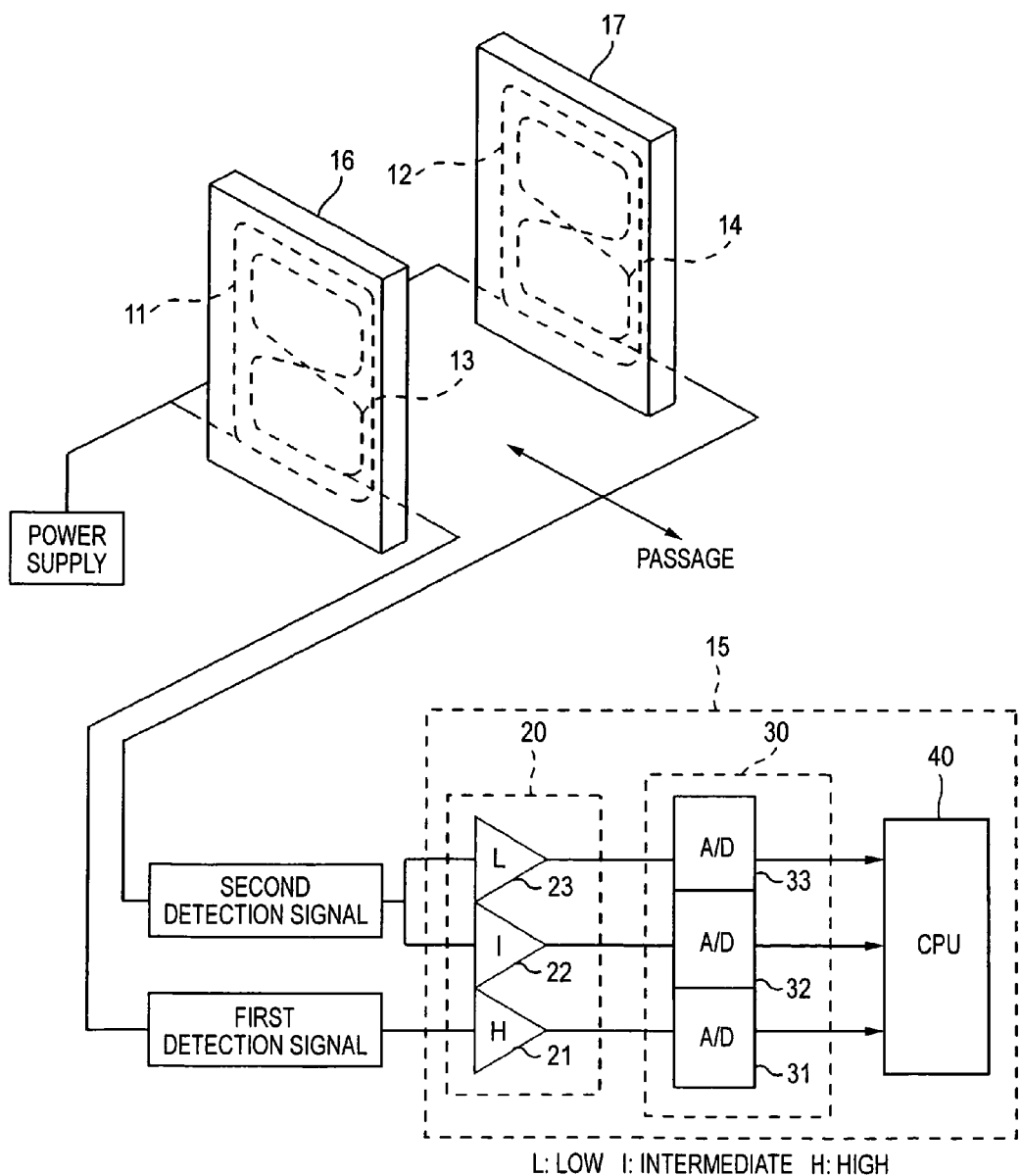

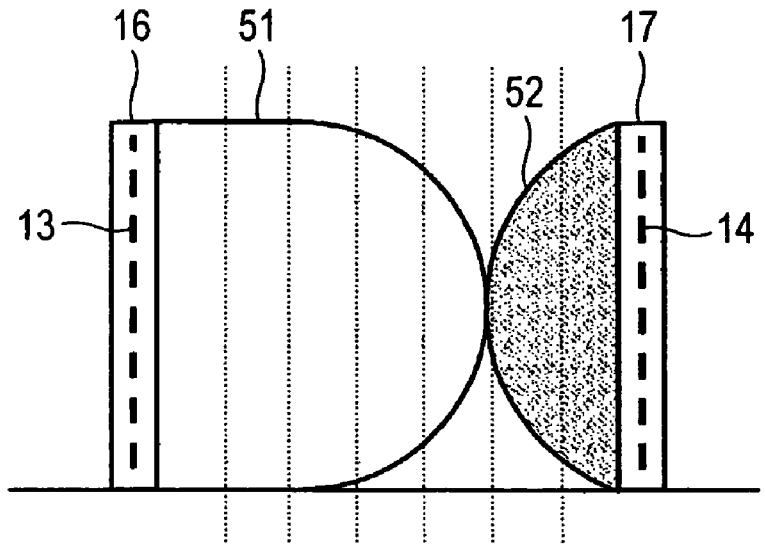
FIG. 4A    ONE SHEET
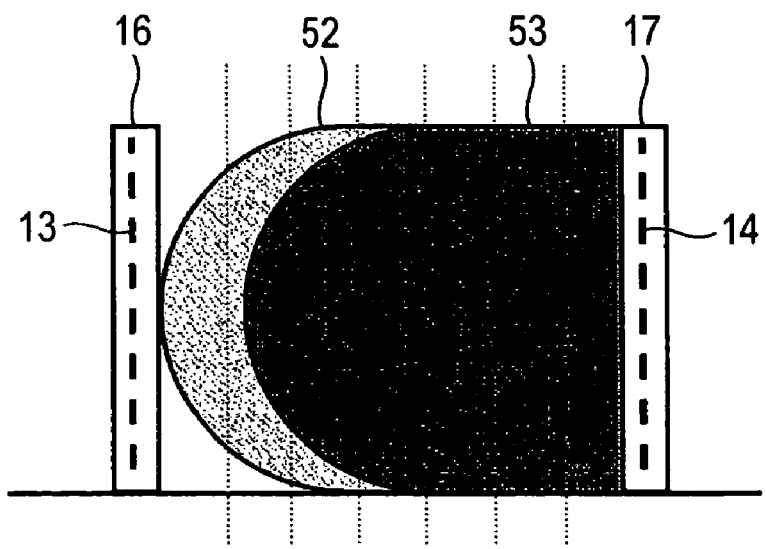
FIG. 4B    500 SHEETS

BAGGAGE MANAGEMENT GATE

CROSS-REFERENCE TO RELATED APPLICATIONS

This application is based on and claims priority under 35 USC 119 from Japanese Patent Application No. 2007-242490 filed Sep. 19, 2007.

BACKGROUND

1. Technical Field

The present invention relates to a baggage management gate that detects a variation in a magnetic field due to magnetization reversal of a magnetic material showing a large Barkhausen effect and manages the passage of baggage that is restricted to be carried in or out from a predetermined region based on a result of the detection.

2. Related Art

For example, a baggage management gate has been proposed which detects the passage of baggage that is prohibited to be carried in or out by using a magnetic material showing a large Barkhausen effect and issues an alarm.

A soft magnetic material, such as a Fe—Co-based amorphous metal wire, has been known as the magnetic material showing the large Barkhausen effect. When an alternating magnetic field stronger than a coercive force is applied to the magnetic material, the magnetization of the magnetic material is rapidly reversed, which results in a variation in the magnetic field. When the magnetic material showing the large Barkhausen effect is added to objects that are restricted to be carried in or out, it is possible to detect the objects passing through the baggage management gate by detecting the variation in the magnetic field.

The baggage management gate may be installed in, for example, an entrance of a management region in which objects that are prohibited to be carried in or out is managed, thereby managing the carrying-in or carrying-out of the objects.

SUMMARY

According to an aspect of the invention, a baggage management gate includes an exciting coil, a detecting coil and a signal processing unit. The exciting coil forms an alternating magnetic field in a passage to an area from which manages objects to be carried in or carried out. The detecting coil detects a variation in the alternating magnetic field when magnetization of a magnetic material showing a large Barkhausen effect is reversed in the alternating magnetic field. The signal processing unit determines as to whether the magnetization reversal occurs in the alternating magnetic field due to the large Barkhausen effect or not, based on a signal detected by the detecting coil. The signal processing unit includes amplifier that amplifies the signal detected by the detecting coil with plural different amplification factors and output the amplified signals with each of the plural different amplification factors.

BRIEF DESCRIPTION OF THE DRAWINGS

Exemplary embodiments of the present invention will be described in detail based on the following figures, wherein:

FIG. 3 is a diagram schematically illustrating the structure of a baggage management gate according to an exemplary embodiment of the invention;

FIG. 4 is a conceptual diagram illustrating the detection range of a magnetic material showing a large Barkhausen effect in the baggage management gate shown in FIG. 3;

DETAILED DESCRIPTION

Hereinafter, exemplary embodiments of the invention will be described with reference to the accompanying drawings.

Figure 1:
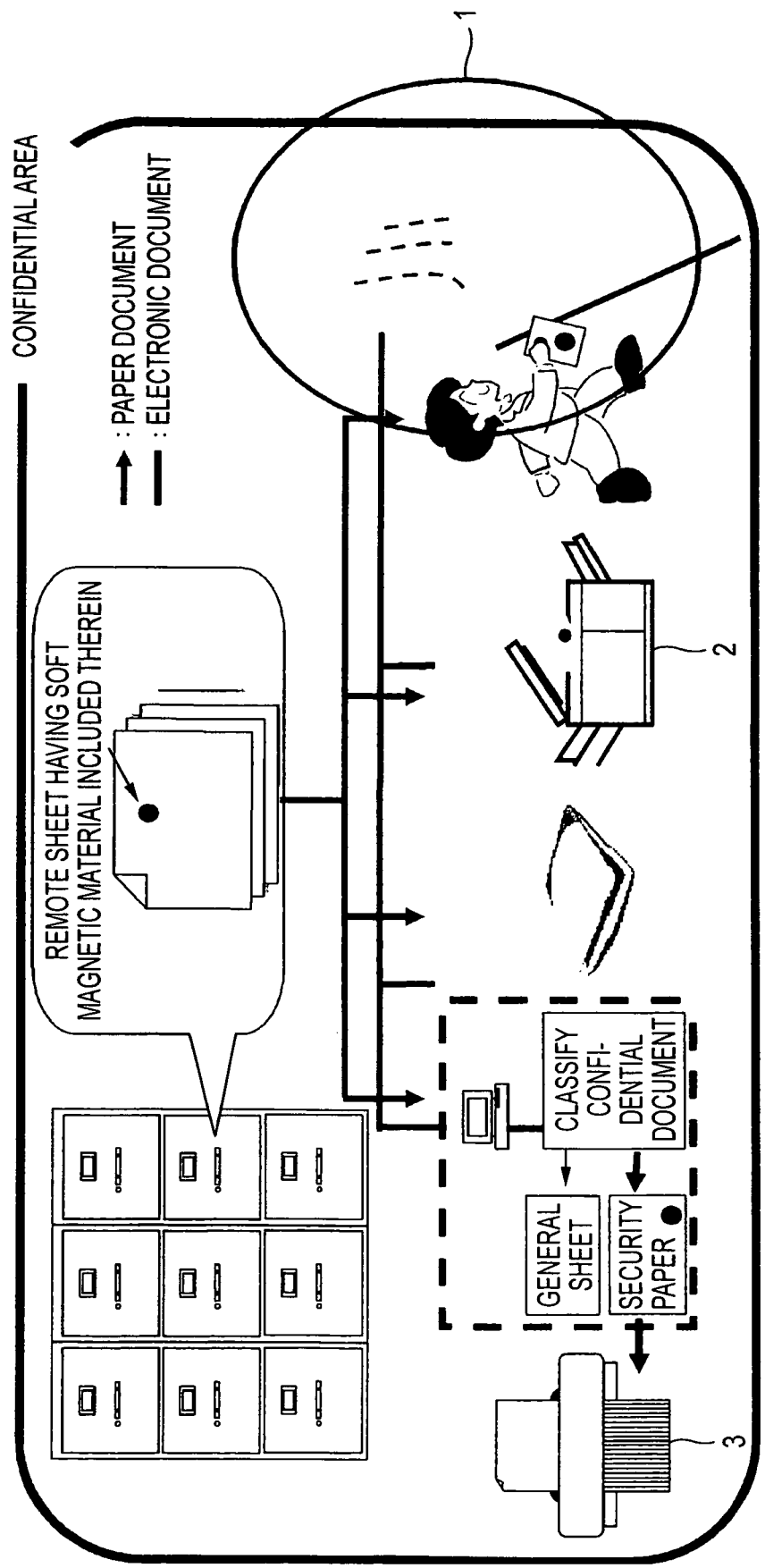
FIG. 1 is a diagram schematically illustrating the structure of a secret management system capable of using a baggage management gate according to an exemplary embodiment of the invention.

A baggage management gate 1 is a gate for detecting confidential documents included in baggage. And the baggage management gate 1 is installed in an entrance of a confidential area, as shown in FIG. 1, so as to prevent the confidential documents from being carried out from the confidential area illegally or by mistake.

In the confidential area, confidential affairs are kept as documents or electronic information, and the confidential documents are created by a printer or a copying machine 2. In this case, the confidential document is made of so-called security paper containing magnetic materials that show a large Barkhausen effect. The confidential document is shredded by a shredder 3 in the confidential area.

Figure 2:
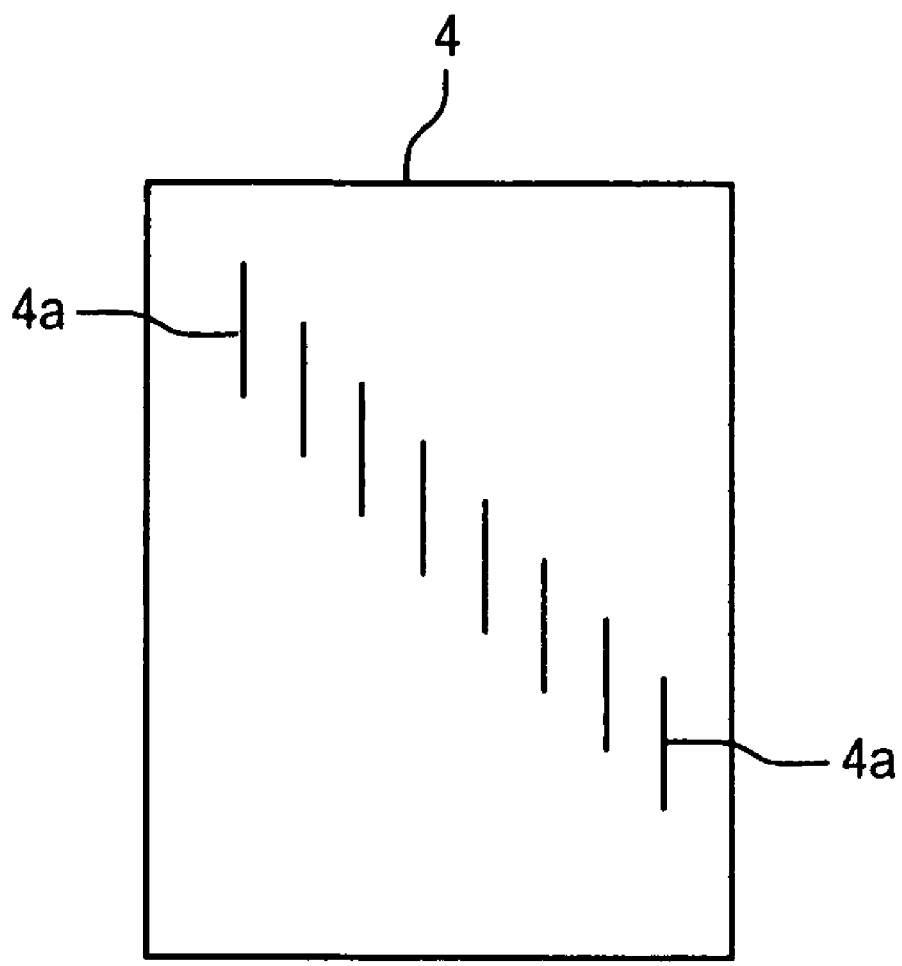
FIG. 2 is a diagram schematically illustrating a sheet used for a confidential document, which is an object to be managed by the secret management system shown in FIG. 1.

For example, a sheet shown in FIG. 2 may be used as the security sheet.

A security sheet 4 contains magnetic materials wire 4a showing the large Barkhausen effect provided in fiber of the sheet. The magnetic materials wire 4a may be spread substantially in the entire surface of the sheet. And the magnetic materials wire 4a may be arranged regularly as shown in FIG. 2 or may be distributed randomly. In addition, the magnetic materials wire 4a may be provided in the fiber of the sheet such that they cannot be easily removed from the sheet. The magnetic material may be formed of, for example, a Fe—Co-based amorphous metal wire (which has a diameter of about several tens of micrometers and a length of 1 mm or more). In addition, a soft magnetic material showing the large Barkhausen effect may be used.

FIG. 3 is a diagram schematically illustrating the structure of a baggage management gate that is installed in an entrance of the confidential area.

The baggage management gate includes exciting coils 11 and 12 that are provided so as to face a passage to a confidential area and form an alternating magnetic field, detecting coils 13 and 14 that detect a variation in the magnetic field when the magnetization reversal of a magnetic material showing the large Barkhausen effect occurs in the magnetic field formed by the exciting coils 11 and 12, and a signal processing unit 15 that determines as to whether the magnetic material showing the large Barkhausen effect exists based on the output of the detecting coils or not. A pair of the exciting coil 11 and the detecting coil 13 and a pair of the exciting coil 12 and the detecting coil 14 are accommodated in a first case 16 and a second case 17 that are provided at both sides of the passage, respectively.

The signal processing unit 15 includes: an amplifying circuit 20 (an example of the amplifier) that amplifies the output (hereinafter, referred to as a first detection signal) of the first detecting coil 13 accommodated in the first case 16 and the output (hereinafter, referred to as a second detection signal) of the second detecting coil 14 accommodated in the second case 17 with plural different predetermined amplification factors, and outputs the amplified signals; an A/D converting circuit 30 that converts the signals output from the amplifying circuit 20 into digital signals; and a CPU 40 that determines as to whether a magnetic material showing the large Barkhausen effect exists based on the signals output from the A/D converting circuit 30 or not.

The amplifying circuit 20 includes: a first amplifier 21 that amplifies the first detection signal with the highest amplification factor (for example, about the maximum value of a general-purpose analog substrate, that is, in a range of about 130 to about 135 dB, which is hereinafter referred to as a high gain); a second amplifier 22 that amplifies the second detection signal with a second amplification factor that is lower than the first amplification factor (for example, about an intermediate value of the general-purpose analog substrate in trimmer adjustment, that is, in a range of about 100 to about 120 dB, which is hereinafter referred to as an intermediate gain); and a third amplifier 23 that amplifies the second detection signal with a third amplification factor that is lower than the second amplification factor (for example, about a minimum value of the general-purpose analog substrate in trimmer adjustment, that is, in a range of about 70 to about 90 dB, which is hereinafter referred to as a low gain).

The A/D converting circuit 30 includes: a first A/D converter 31 that converts the signal amplified by the first amplifier 21 into a digital signal; a second A/D converter 32 that converts the signal amplified by the second amplifier 22 into a digital signal; and a third A/D converter 33 that converts the signal amplified by the third amplifier 23 into a digital signal. The number of A/D converters provided in the A/D converting circuit 30 corresponds the number of amplifiers of the amplifying circuit 20.

The CPU 40 detects a variation in the magnetic field caused by the large Barkhausen effect, based on the digital signals output from the A/D converting circuit 30. The digital signals are amplified with different amplification factors. Therefore, even when the signal amplified with the first amplification factor or the second amplification factor exceeds an upper limit of the output of the amplifier and the detected waveform thereof is distorted, that is, even in a saturated state, the signal amplified with an amplification factor that is lower than the first or second amplification factor may not be saturated. Therefore, the signals in an unsaturated state are selected from the signals amplified with different amplification factors, and a large Barkhausen signal is detected from the signal amplified with the maximum amplification factor among the selected signals. When the large Barkhausen signal is detected in this way, it is possible to determine that a confidential document which is an object to be managed, is included in the baggage of a passenger.

Meanwhile, it is also possible to detect the large Barkhausen signal from all of the amplified signals, without determining as to whether the amplified signals are in a saturated state or not. When the large Barkhausen signal is detected from any one of the amplified signals, it is determined that a confidential document is included in the baggage of the passenger. When no large Barkhausen signal is detected from the amplified signals, it is determined that no confidential document is included in the baggage of the passenger.

FIGS. 4A and 4B are conceptual diagrams illustrating the relationship between the amplification factor and the detection range of a signal when a confidential document including a magnetic material showing the large Barkhausen effect passes through the baggage management gate. Specifically, FIG. 4A is a conceptual diagram illustrating the relationship when one sheet is carried out, and FIG. 4B is a conceptual diagram illustrating the relationship when 500 sheets are carried out.

In general, when a magnetic material passes through the vicinity of the detecting coil, the level of the detected large Barkhausen signal is high. When a magnetic material passes through a place apart from the detecting coil, the level of the detected large Barkhausen signal becomes lower. Therefore, when the minimum unit of the magnetic material, that is, the magnetic material included in one sheet passes through the passage, the detection range of the magnetic material is widened from a position where the detecting coil is provided to the inside of the passage. The higher the amplification factor of the signal becomes, the wider the detection range of the magnetic material becomes. Meanwhile, when the amount of magnetic material increases, that is, plural sheets are carried, the level of the detection signal increases, and it is possible to detect the large Barkhausen signal even with a low amplification factor. However, when the amplification factor is high, a non-detection region in which no magnetic material is detected may be formed in the vicinity of the detecting coil due to the saturation of the amplified signals. That is, when a variation in the magnetic field occurs in the vicinity of the detecting coil due to a large amount of magnetic material, the level of the signal is high, and the signal is amplified with a high amplification factor. As a result, the level of the signal exceeds the upper limit of the output of the amplifier.

FIG. 4A is a latitudinal cross-sectional view illustrating the detection region of one sheet when the one sheet passes through the passage. The first detection signal detected by the first detecting coil 13 is amplified with the first amplification factor (high gain), which is the highest amplification factor, and the second detection signal detected by the second detecting coil 14 is amplified with the second amplification factor (intermediate gain) that is lower than the first amplification factor. Detection regions 51 and 52 capable of detecting the passage of one sheet using the detection signals are widened from the detecting coils to the center of the passage. Therefore, the sheet can be detected in least one of the detection regions 51, 52. However, there is no detection range by the signal that is amplified with the third amplification factor (low gain). That is, since the signal level detected from one sheet is low and the amplification factor is low, it is difficult to detect the large Barkhausen signal.

The amplification factors of the high gain and the intermediate gain may be set such that the minimum unit of the magnetic material can be detected in the entire cross section of the passage and, when the magnetic material passes through the vicinity of the detecting coil, the amplified detection signal is not saturated. For example, when the amplification factor of the high gain or the amplification factor of the intermediate gain is lowered, the detection region 51 at the high gain or the detection region 52 at the intermediate gain is narrowed, and a non-detection region in which a magnetic material showing the large Barkhausen effect cannot be detected is formed between the detection region 51 at the high gain and the detection region 52 at the intermediate gain. In contrast, when the amplification factor of the high gain or the amplification factor of the intermediate gain increases, both the detection region 51 at the high gain and the detection region 52 at the intermediate gain are widened and an overlapping region therebetween is formed. However, a region in which the detection signal is saturated may be formed in the vicinity of the first detecting coil 13 or the second detecting coil 14.

FIG. 4B is a latitudinal cross-sectional view illustrating the detection region of 500 sheets when 500 sheets pass through the passage at one time. When 500 sheets pass through the passage at one time, there are the detection region 52 at the intermediate gain and the detection region 53 at the low gain, but there is no detection range at the high gain. The reason why there is no detection range at the high gain is that the level of the detection signal for a variation in the magnetic field caused by the magnetic materials included in 500 sheets is high and the amplification factor of the high gain causes the saturation of the detection signal. Although the amplification factor of the intermediate gain causes the saturation of the detection signal in the vicinity of the second detecting coil 14, the region in which the saturation occurs is included in the detection region 53 by the detection signal that is amplified at the low gain. As a result, the saturation of the detection signal is complemented by the detection region 53.

As described above, in the baggage management gate, the detection region of the magnetic material is determined by the amplification factor of the first detection signal, the amplification factor of the second detection signal, and the amount of magnetic material showing the large Barkhausen effect included in baggage. Therefor, the amplifying circuit 20 and the A/D converting circuit 30 are set such that, regardless of the position where an object to be managed passes through the passage of the baggage management gate, the magnetic material can be detected by the signal amplified with least one amplification factor and at least one of the signals amplified with plural amplification factors is not saturated.

As described above, it is possible to cope with a variation in the level of the detection signal due to the amount of magnetic material by amplifying the detection signals with plural different amplification factors. In addition, the experiments prove that it is possible to detect a magnetic material showing the large Barkhausen effect without affecting the signal level, even when the signal level varies according to the moving direction of baggage. For example, when the baggage is a sheet including a magnetic material showing the large Barkhausen effect, it is possible to detect the magnetic material with substantially the same detection accuracy, regardless of the direction of the plane of the sheet, for example, even when the longitudinal direction of the sheet is parallel or orthogonal to a vertical plane and a horizontal plane of the passage, and even when the surface of the sheet faces in all directions in a space surrounded by the baggage management gate. In addition, it is possible to detect a magnetic material included in the baggage even when objects to be detected are mixed with, for example, other magnetic materials, such as steel cans.

Next, a baggage management gate according to another exemplary embodiment of the invention will be described.

The baggage management gate according to this embodiment includes exciting coils 11 and 12, detecting coils 13 and 14, and a signal processing unit 15, similar to the baggage management gate shown in FIG. 3, but differs from the baggage management gate shown in FIG. 3 in that a first detection signal detected by the first detecting coil 11 and a second detection signal detected by the second detecting coil 12 are amplified with different amplification factors from those in the baggage management gate shown in FIG. 3.

Figure 5:
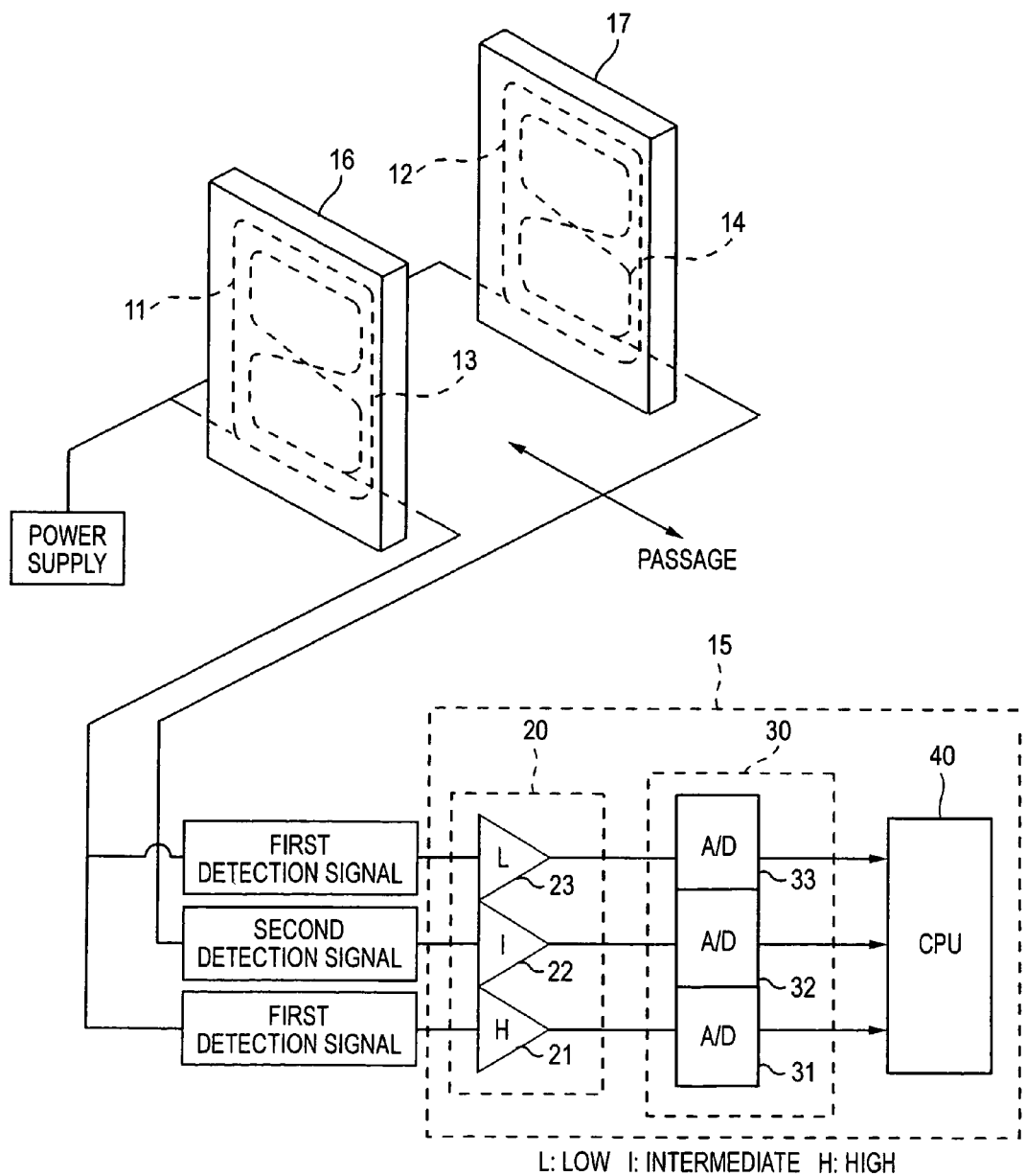
FIG. 5 is a diagram schematically illustrating the structure of a baggage management gate according to another exemplary embodiment of the invention.

As shown in FIG. 5, in the baggage management gate, the first detection signal is amplified with the first amplification factor and the third amplification factor, and the second detection signal is amplified with the second amplification factor. The first amplification factor has the largest value, followed by the second amplification factor and the third amplification factor.

The amplification factors are set as follows.

Figure 6A:
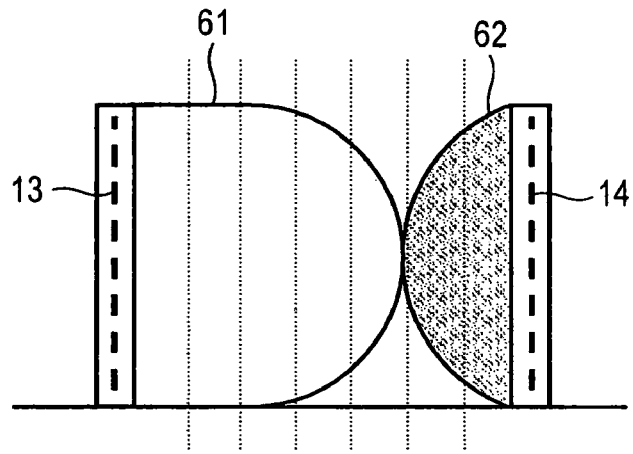
FIG. 6 is a conceptual diagram illustrating the detection range of a magnetic material showing a large Barkhausen effect in the baggage management gate shown in FIG. 5.

As described above, when a sheet having confidential information written thereon is used as an object to be managed, the amount of magnetic material included in one sheet is the minimum unit of the magnetic material. When the one sheet passes through a passage, the detection region of the magnetic material is set as shown in FIG. 6A. That is, the detection regions are set such that a detection region 61 of the magnetic material by the first detection signal amplified with the first amplification factor and a detection region 62 of the magnetic material by the second detection signal amplified with the second amplification factor are widened from the first detecting coil 13 and the second detecting coil 14 toward the inside of the passage, respectively, and the magnetic material can be detected by at least one of the first and second detection signals in the entire cross section of the passage.

Figure 6B:
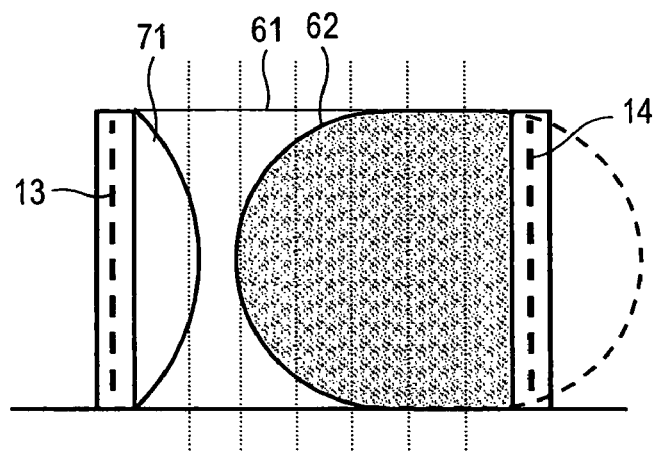
Figure 6C:
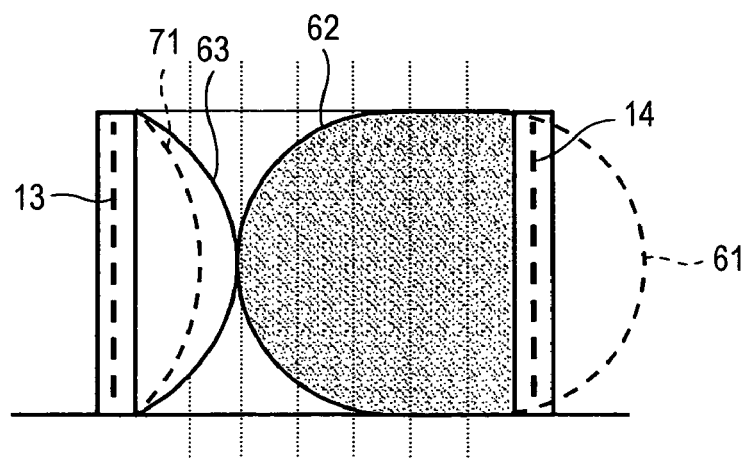

When a passenger carries plural sheets and the level of the detection signal increases due to the large Barkhausen effect, as shown in FIG. 6B, the detection region 61 of the magnetic material by the first detection signal and the detection region 62 of the magnetic material by the second detection signal overlap each other, and the detection signal amplified with the first amplification factor is saturated in the vicinity of the first detecting coil 13, which results in a non-detection region 71 in which no magnetic material is detected. In contrast, as shown in FIG. 6C, the first detection signal detected by the first detection coil 13 is amplified with the third amplification factor such that the detection region 63 by the signal amplified with the third amplification factor complements the non-detection region 71 in which no magnetic material is detected due to the saturation.

Figure 7:
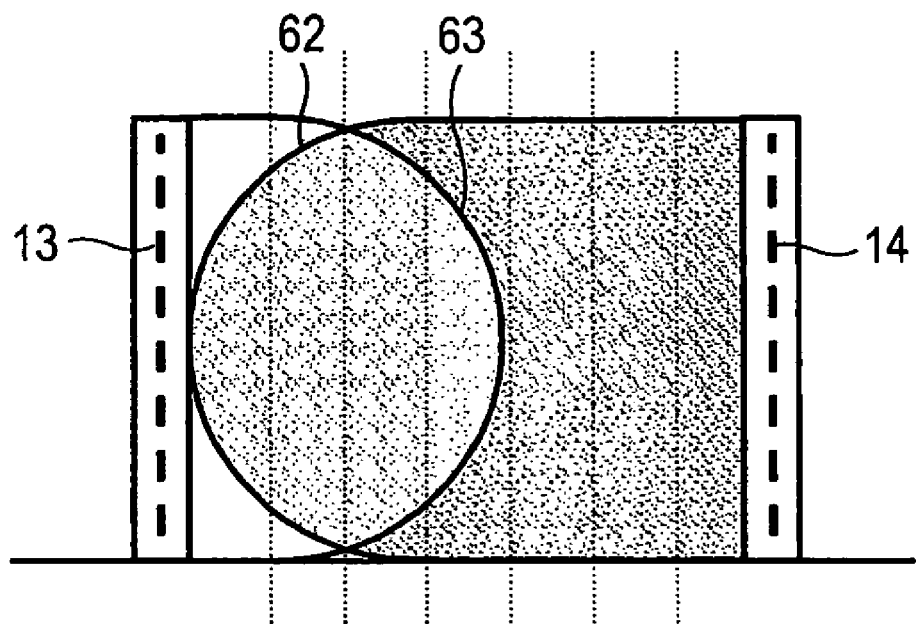
FIG. 7 is a conceptual diagram illustrating the detection range of a magnetic material showing the large Barkhausen effect in the baggage management gate shown in FIG. 5.

When the number of sheets carried by the passenger further increases, as shown in FIG. 7, the detection region 62 of the magnetic material by the second detection signal amplified with the second amplification factor overlaps the detection region 63 of the magnetic material by the first detection signal amplified with the third amplification factor. Therefore, even when an assumed maximum number of sheets having magnetic materials included therein pass through the passage, it is possible to detect the magnetic materials in the entire cross section of the passage without saturating the amplified signals.

Figure 8A:
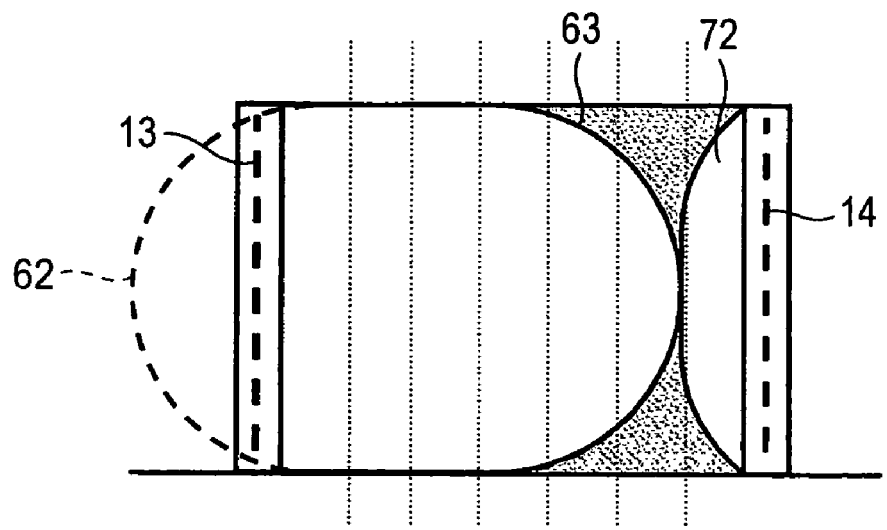
FIG. 8 is a conceptual diagram illustrating the detection range of a magnetic material showing the large Barkhausen effect in the baggage management gate shown in FIG. 5.
Figure 8B:
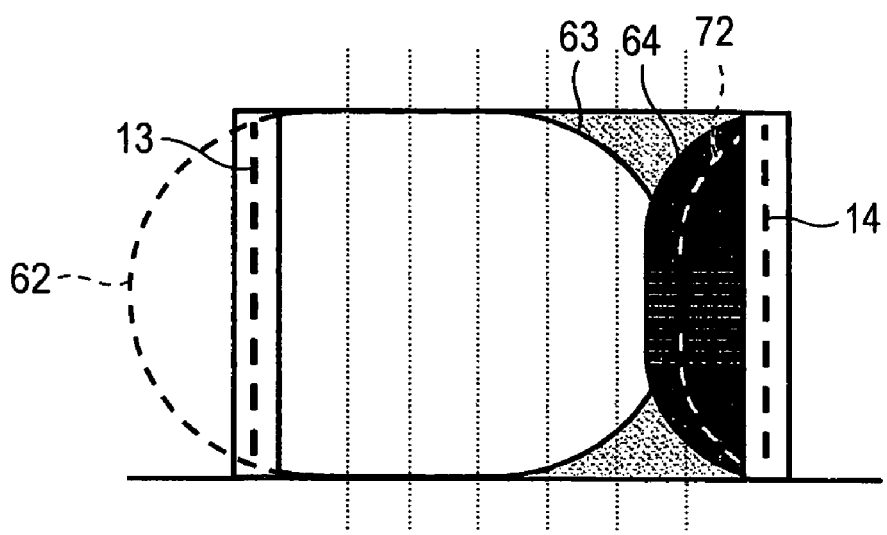

Furthermore, in order to detect a larger amount of magnetic material, the second detection signal detected by the second detecting coil may be amplified with a fourth amplification factor that is lower than the third amplification factor, and the amplified signal may be used to detect the magnetic material. In this case, as shown in FIG. 8A, when the magnetic material passes through the vicinity of the second detecting coil, the second detection signal amplified with the second amplification factor is saturated, which results in a region 72 in which no magnetic material is detected. However, as shown in FIG. 8B, the amplification factors can be set such that a detection region 64 in which the magnetic material can be detected by the second detection signal that is amplified with the fourth amplification factor complements the range 72.

Although the exemplary embodiments of the invention have been described above, the invention is not limited thereto. Various modifications and changes can be made without departing from the scope and spirit of the invention. For example, the shapes of the exciting coils and the detecting coils accommodated in the first case and the second case may be appropriately changed, and the number of coiling and the like may be appropriately changed according to the installation position of the baggage management gate and the type of objects to be detected. The position of the baggage management gate is not limited to the side of the passage, but the baggage management gate may be installed on the ceiling or the floor. In addition, the number of amplification factors of the first detection signal and the second detection signal and the number of A/D converters and amplifiers controlling the amplification factors may be appropriately changed according to objects to be detected.

Furthermore, the objects to be detected are not limited to the confidential documents, but goods or office appointments may be detected. That is, any kind of object may be detected as long as it can be provided with a magnetic material showing the large Barkhausen effect.

What is claimed is:

1. A baggage management gate comprising:
   an exciting coil that forms an alternating magnetic field in a passage to an area from which manages objects to be carried in or carried out;
   a detecting coil that detects a variation in the alternating magnetic field when magnetization of a magnetic material showing a large Barkhausen effect is reversed in the alternating magnetic field; and
   a signal processing unit that determines as to whether the magnetization reversal occurs in the alternating magnetic field due to the large Barkhausen effect or not, based on a signal detected by the detecting coil, the signal processing unit including a plurality of amplifiers, each amplifier amplifying the signal detected by the detecting coil with a different amplification factor and outputting the amplified signal with the different amplification factor to a central processing unit, wherein
   the detecting coil includes a first detecting coil that is provided on one side of the passage and a second detecting coil that is provided on the other side of the passage,
   a signal detected by the first detecting coil is amplified with a first amplification factor,
   a signal detected by the second detecting coil is amplified with a second amplification factor that is lower than the first amplification factor, and
   the signal detected by the first detecting coil is amplified with a third amplification factor that is lower than the second amplification factor.

2. A baggage management gate comprising:
   an exciting coil that forms an alternating magnetic field in a passage to an area from which manages objects to be carried in or carried out,
   a detecting coil that detects a variation in the alternating magnetic field when magnetization of a magnetic material showing a large Barkhausen effect is reversed in the alternating magnetic field; and
   a signal processing unit that determines as to whether the magnetization reversal occurs in the alternating magnetic field due to the large Barkhausen effect or not, based on a signal detected by the detecting coil, the signal processing unit including a plurality of amplifiers, each amplifier amplifying the signal detected by the detecting coil with a different amplification factor and outputting the amplified signal with the different amplification factor to a central processing unit, wherein
   the detecting coil includes a first detecting coil that is provided on one side of the passage and a second detecting coil that is provided on the other side of the passage,
   a signal detected by the first detecting coil is amplified with a first amplification factor,
   a signal detected by the second detecting coil is amplified with a second amplification factor that is lower than the first amplification factor, and
   the signal detected by the second detecting coil is amplified with a third amplification factor that is lower than the second amplification factor.

\* \* \* \* \*